(12) United States Patent
Krahl et al.

(10) Patent No.: US 6,384,412 B1
(45) Date of Patent: May 7, 2002

(54) ELECTRON MICROSCOPE WITH AN ENERGY FILTER HAVING HEXAPOLE CORRECTORS WHICH ARE COUPLED WITH A PROJECTIVE SYSTEM DOWNSTREAM OF THE ENERGY FILTER

(75) Inventors: Dieter Krahl; Stephan Kujawa, both of Berlin (DE)

(73) Assignee: LEO Elektronenmikroskopie GmbH, Oberkochen (DE)

( * ) Notice: Subject to any disclaimer, the term of this patent is extended or adjusted under 35 U.S.C. 154(b) by 0 days.

(21) Appl. No.: 09/339,822

(22) Filed: Jun. 25, 1999

(30) Foreign Application Priority Data

Jun. 27, 1998 (DE) .......................................... 198 28 741

(51) Int. Cl.$^7$ ............................................... H01J 49/46
(52) U.S. Cl. ............................... 250/305; 250/396 ML; 250/309
(58) Field of Search ............................... 250/305, 309, 250/311, 396 ML

(56) References Cited

U.S. PATENT DOCUMENTS 4,694,170 A * 9/1987 Slodzian et al. ............ 250/309
5,448,063 A * 9/1995 De Jong et al. ............ 250/305

OTHER PUBLICATIONS

"2. Electron Optics of Imaging Energy Filters" by H. Rose and D. Krahl in Optical Sciences, pp. 86 to 149.
"Second–rank aberrations of a magnetic imaging energy filter: measurement and correction" by S. Kujawa et al, Optik 86 (1990) Nov., No. 2, Stuttgart, Germany.

* cited by examiner

Primary Examiner—Kiet T. Nguyen
Assistant Examiner—David A. Vanore
(74) Attorney, Agent, or Firm—Walter Ottesen

(57) ABSTRACT

The invention is directed to an electron microscope having a magnetic energy filter. The energy filter has four deflection regions and seven hexapole correctors for correcting the aberrations of the energy filter. A projection system is mounted downstream of the filter. With the projection system, the achromatic image plane is selectively imaged onto the CCD camera for energy-filtered object imaging or the dispersion plane is imaged on a CCD camera for spectrum detection. For an object registration, the hexapoles are so excited that all geometric aberrations of the second order are corrected in the achromatic image plane and in the dispersion plane. For the spectrum imaging, the excitation of three hexapoles is so changed that the axial chromatic aberration of the filter is corrected while maintaining the correction of the spherical aberration in the achromatic image plane and while maintaining the correction of all geometric errors of the second order in the dispersion plane.

14 Claims, 3 Drawing Sheets

ELECTRON MICROSCOPE WITH AN ENERGY FILTER HAVING HEXAPOLE CORRECTORS WHICH ARE COUPLED WITH A PROJECTIVE SYSTEM DOWNSTREAM OF THE ENERGY FILTER

BACKGROUND OF THE INVENTION

In imaging energy filters for transmission electron microscopes, aberrations cause lateral resolution losses in the achromatic image plane and in the dispersion plane wherein the energy spectrum of the electrons, which are transmitted through the object, arises and therefore cause a loss of energy resolution. Such energy filters are shown, for example, in U.S. Pat. No. 4,760,261 directed to a so-called alpha filter and in U.S. Pat. No. 4,740,704 directed to a so-called omega filter. The dominating aberrations are of a second rank. The aberrations are defined by eighteen linearly independent aberration coefficients. The defective focusings are then dependent quadratically or bilinearly from geometric parameters such as axis distance of the image points and irradiation aperture and dependent from deviations of the electron energy of the nominal energy.

It is known to correct the geometric errors of the second order (Seidel aberrations) in the achromatic image plane and in the dispersion plane with a symmetrical assembly of the filter and by a astute selection of the guide of the fundamental paths through the filter as well as the use of hexapole correctors. This is known from the work of H. Rose and D. Krahl in "Optical Science", edited by L. Reimer, pages 43 to 149 (Energy Filtering Transmission Electron Microscopy) and from the dissertation of S. Lanio entitled "Optimization of Imaging Energy Filters for the Analytic Electron Microscopy", TH Darmstadt (1986). Because of the hexapole correction, the chromatic aberrations simultaneously vanish in the achromatic image plane. These chromatic aberrations are dependent upon the distance from the axes of the image points and on the energy deviations. In contrast, the axial chromatic aberrations in the achromatic image plane and in the dispersion plane remain uncorrected. The influence of the chromatic aberration in the achromatic image plane on the lateral resolution also can be neglected if a relatively large energy window is selected because this chromatic aberration is relatively small. The component of the chromatic axial aberration error (which is effective in the dispersive direction) in the dispersion plane $C_{\gamma\gamma k}$ effects, in combination with the energy dispersion D of the energy filter, an inclination of the focus plane of the energy loss spectrum by an angle $\Theta$ relative to the dispersion plane in accordance with the equation:

$$\tan \Theta = C_{\gamma\gamma k}/C_{\gamma k}$$

wherein: $C_{\gamma k}$ is the dispersion coefficient which results from $D=C_{\gamma k}/E$. This inclination of the focus plane operates disadvantageously for a parallel registration of energy spectra wherein the dispersion plane is imaged on a detector plane by means of a round lens or a lens combination. The detector plane can, for example, be a photoplate or a CCD camera. A deterioration of the energy resolution with increasing energy loss must be accepted as a consequence of the inclination of the focus plane relative to the dispersion plane because of the axial chromatic error. This effect occurs increasingly when relatively large image fields contribute to the energy spectrum. These energy fields are characterized by a large axis distance parameter $\gamma$. For this reason, it has already been determined in the above-mentioned article of H. Rose and D. Krahl that the axial chromatic aberration must be corrected for parallel registration of energy spectra. Specific suggestions for the correction of the axial chromatic aberration are, however, not given.

U.S. Pat. No. 5,448,063 discloses an omega filter wherein all geometric aberrations of the second order as well as all chromatic aberrations of the second rank, and therefore the axial chromatic aberration, are supposedly corrected by a total of nine hexapole correctors. The examples given here for the filters are, however, not stigmatic in the achromatic image plane, that is, the input image plane of the filter is imaged by the filter astigmatically into the achromatic image plane. The focus differences between the intercepts perpendicular and parallel to the magnetic dipole fields of the deflecting magnets amount for the filters to 26.4 mm and 32.7 mm, respectively. These filters are therefore not suitable for use as imaging filters wherein an energy filtered object image is imaged into the detector plane.

SUMMARY OF THE INVENTION

It is an object of the invention to provide an electron microscope having an imaging magnetic energy filter which is suitable for imaging energy filtered object images or diffraction images into a detector plane as well as for imaging the dispersion plane into a detector plane for a parallel registration of the energy spectrum.

The electron microscope of the invention defines an electron beam path to a detector plane and includes: an imaging magnetic energy filter including a plurality of magnetic deflecting systems arranged symmetrically to a center plane (M) and a plurality of hexapoles arranged between the magnetic deflecting systems; a projection system disposed along the electron beam path downstream of the energy filter; the energy filter defining a dispersion plane (DA) and an achromatic image plane (BA); a control unit operatively connected to the projection system for switching over the projection system for selectively imaging the dispersion plane (DA) and the achromatic image plane (BA) into the detector plane; and, the control unit also being operatively connected to the hexapoles for changing the excitation of at least some of the hexapoles at the same time as the switchover of the projection system.

The electron microscope according to the invention includes an imaging magnetic energy filter having magnetic deflection systems arranged symmetrically to the center plane. The energy filter images a first input plane (the input image plane) stigmatically and achromatically into a first output plane (the achromatic image plane). At the same time, the energy filter images a second input plane (the input diffraction plane) stigmatically and dispersively into a second output plane (the dispersion plane).

Viewed in beam direction, a projection system follows the energy filter and this projection system can selectively image the dispersion plane or the achromatic image plane magnified into a detector plane. When imaging the achromatic image plane into the detector plane, then either an energy filtered object registration takes place (namely when the object is imaged into the input image plane of the energy filter) or an energy filtered registration of the object diffraction diagram takes place (when the Fourier plane of the objective, which images the object, is imaged into the input image plane of the energy filter). With the imaging of the dispersion plane into the detector plane, a parallel registration of the energy spectrum of the electrons takes place. The energy spectrum results after the interaction with the object.

Hexapole correctors are provided at least between the deflection magnets of the energy filter. Additional hexapole correctors are also mounted in the input image plane and in the achromatic image plane. A switchover of the excitations of a part of the hexapole correctors takes place with a switchover between the imaging of the achromatic image plane and the imaging of the dispersion plane into the detector plane. When imaging the achromatic image plane, the hexapoles are usually so excited that all geometric errors of the second order (Seidel aberrations) are corrected in the achromatic image plane. In contrast, when imaging the dispersion plane into the detector plane, the hexapoles are so excited, that, in addition to a spherical aberration of the second order, also the axial chromatic aberration of the energy filter or of the system (made up of energy filters and projection systems) is corrected in the dispersion plane. In contrast, other geometric image errors of the second order are permitted in the achromatic image plane since these geometric image errors are not disturbing when imaging the dispersion plane into the detector plane in order to take an energy spectrum.

The invention is based on the realization that a correction of the axial chromatic aberration while simultaneously maintaining the correction of the spherical aberration of the second order $C_{\gamma\gamma k}$ is possible without additional hexapoles with a corresponding change of the excitation of the hexapoles already available for a correction of the geometric errors of the second order. Although geometric image errors of the second order occur because of the changed hexapole excitations, it was however recognized that these geometric image errors do not constitute a disturbance when imaging the dispersion plane into the detector plane and therefore precisely in those cases wherein the axial chromatic aberration becomes disadvantageously noticeable. Compared to electron microscopes having energy filters wherein the axial chromatic aberration is uncorrected, the invention makes possible a significantly increased energy resolution for a parallel registration of energy loss spectra without causing additional structural complexity.

In addition to the axial chromatic aberration of the energy filter, also off-axis chromatic aberrations of the projection system arranged downstream of the energy filter contributes to the inclination of the focus plane in the dispersion plane. Depending upon the sign and magnitude of these off-axis chromatic aberrations of the projection system, the axial chromatic aberration of the energy filter can be overcorrected or be undercorrected via a corresponding excitation of the hexapoles so that the remaining residual of the axial chromatic aberration of the energy filter compensates the off-axis chromatic aberrations of the projection system.

The energy filter includes four magnetic deflecting regions in a specific embodiment of the invention. Two hexapoles each are provided between the first and second deflecting region and two further hexapoles are provided between the third and fourth deflection region. The two hexapoles between the third and fourth deflection region are symmetrical to the two hexapoles between the first and second deflecting regions. Furthermore, an additional hexapole is mounted in the symmetry plane of the energy filter. When switching over between the imaging of the dispersion plane and the imaging of the achromatic image plane, only the excitation of the following is changed: one of the two hexapoles between the first and second deflecting region, one of the hexapoles symmetrical thereto between the second and fourth deflecting region and the hexapole in the symmetry plane. In contrast, the excitations of all other hexapoles remain unchanged during the switchover. The excitation change of the hexapole between the first and second deflecting regions and of the hexapole symmetrical thereto between the third and fourth deflecting regions is opposite to the excitation change of the hexapole in the symmetry plane.

In the specific embodiment described, two further hexapoles are provided of which one is mounted in the achromatic image plane and the other is mounted in the input plane conjugated thereto (that is, the input image plane of the energy filter).

When imaging the dispersion plane into the detector plane, the excitation of the hexapole in the symmetry plane is greater by a factor of 2 to 4 (preferably by a factor of 2.81) than when imaging the achromatic image plane into the detector plane. In contrast thereto, the excitation of the first hexapole rearward of the first deflection region is greater when imaging the achromatic image plane into the detector plane by a factor of 1.5 to 2.5 (preferably, by a factor of 1.87) than when imaging the dispersion plane into the detector plane.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
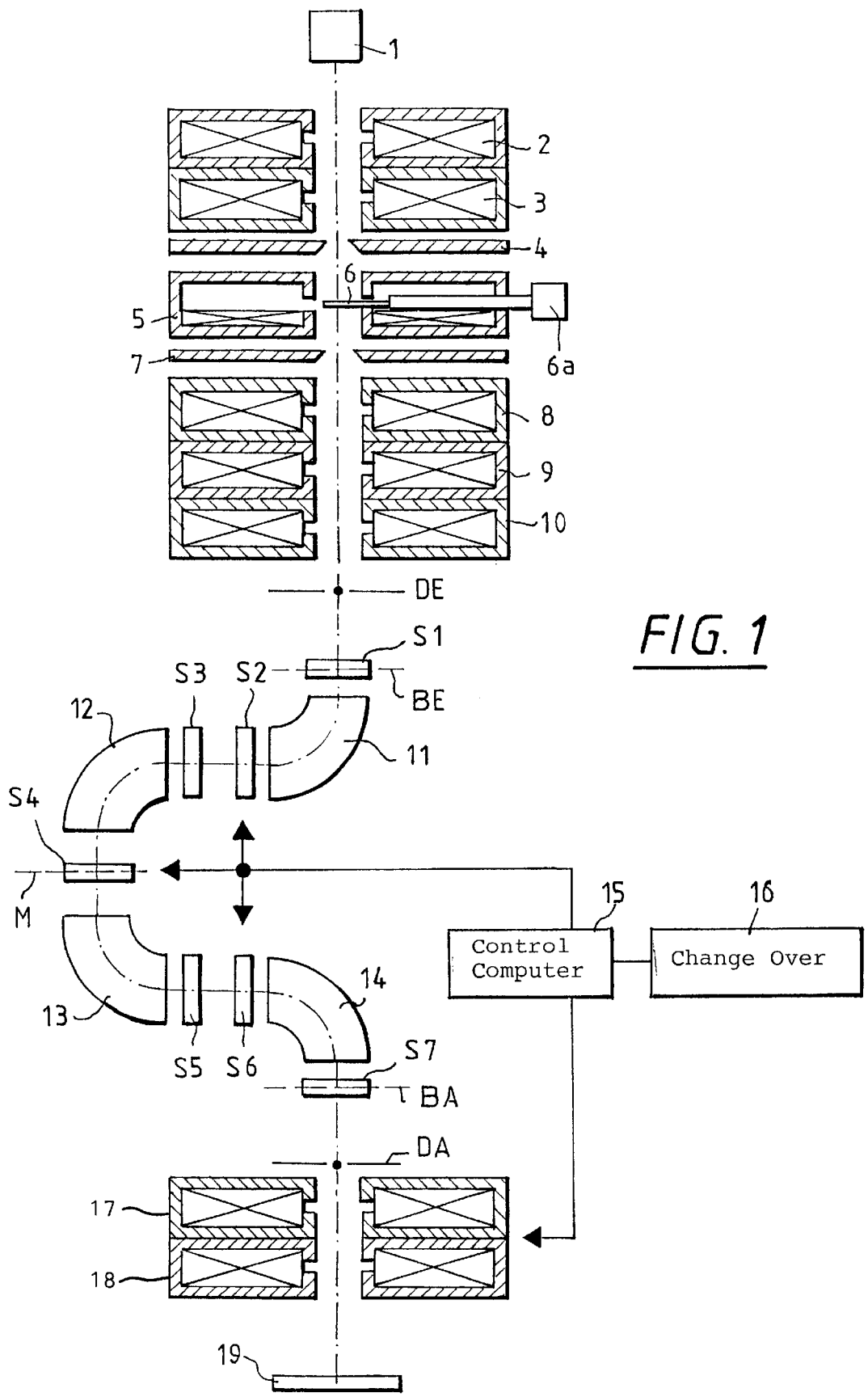
FIG. 1 is a schematic, in section, of an electron microscope according to the invention.

The upper portion of the transmission electron microscope shown in FIG. 1 includes a conventional configuration as disclosed in U.S. Pat. No. 4,812,652 incorporated herein by reference.

The transmission electron microscope includes an energy source 1 and a two-stage condenser (2, 3) downstream of the energy source (1). A collimated electron beam is generated by the condenser (2, 3) from the electrons emanating from the electron source. The aperture of the electron beam is determined by the opening diameter of the aperture diaphragm 4. The object 6 is positioned in the poleshoe gap of the objective 5 and is illuminated by this collimated electron beam. The object 6 is mounted on a manipulator 6a so that the object can be manipulated. The manipulator 6a is guided through the objective lens 5.

Three imaging stages (8, 9, 10) are mounted downstream of the objective lens 5 and are likewise configured as magnetic lenses. A magnified image of the object 6 or of the diffraction diagram of the object 6 is generated in the input image plane BE of the energy filter (11 to 14) by means of the three imaging stages (8, 9, 10). The magnitude of the transmitted image field is determined by the aperture diameter of the field diaphragm 7 mounted downstream of the objective 5. The imaging conditions forward of the entry into the energy filter (11 to 14) correspond to the imaging conditions described in U.S. Pat. No. 4,812,652 so that, independently of the adjusted magnification for the object imaging, an image of the object lies in the input image plane BE of the energy filter (11 to 14) and an image of the electron source 1 lies in the input diffraction plane DE of the energy filter. When making recordings of object diffraction diagrams, an image of the electron source 1 lies in the input image plane BE of the energy filter and an image of the object 6 lies in the input diffraction plane DE.

Figure 3:
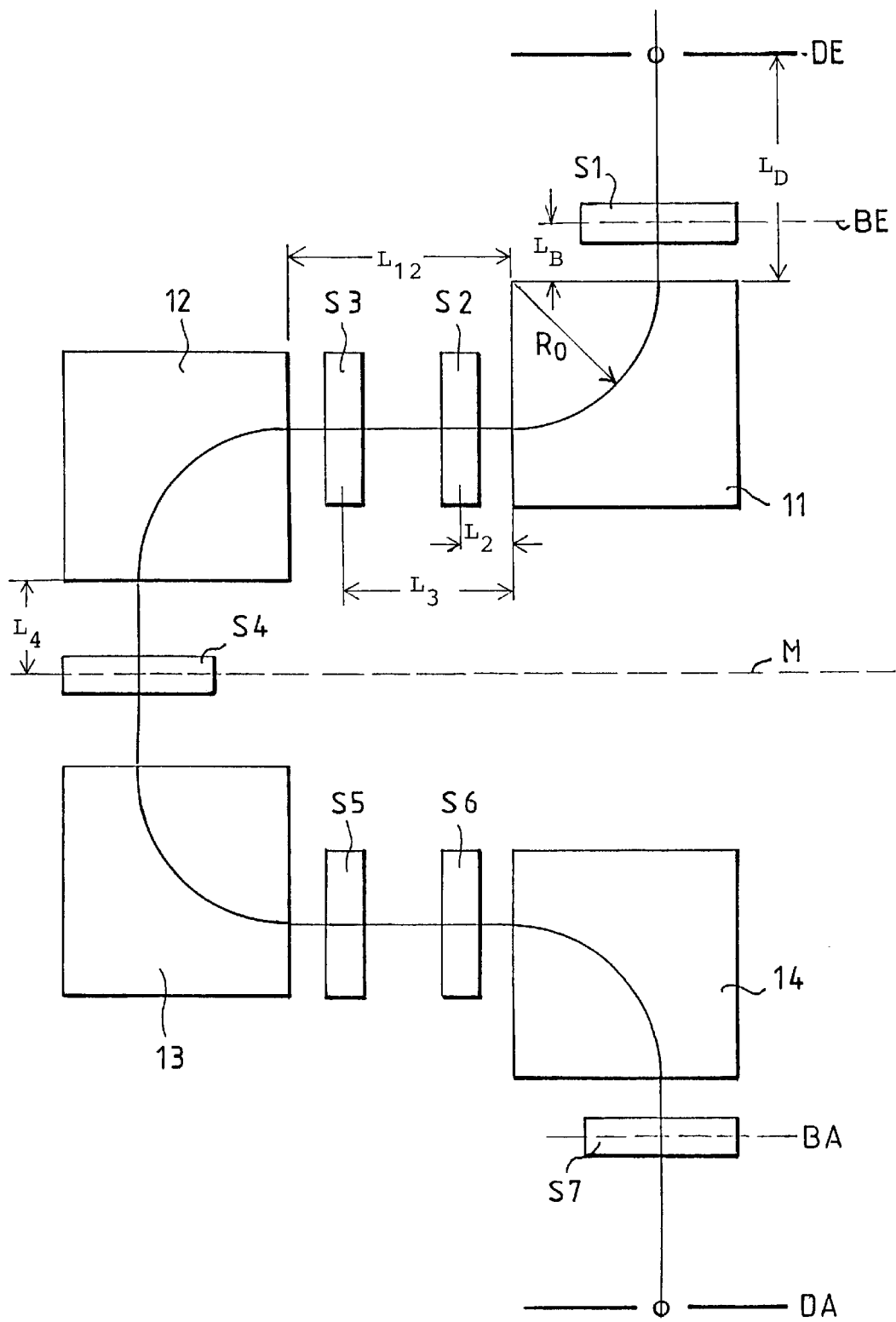

The energy filter is configured as a so-called omega filter having four magnetic deflection regions (11 to 14) arranged symmetrically to the center plane M. The deflecting regions (11 to 14) guide the electrons on a path which corresponds to the Greek letter "Ω". The magnetic field direction in the deflecting regions (11 to 14) is, in each case, perpendicular to the plane of the drawing of FIG. 1. The electrons entering into the energy filter and having the desired energy are subjected to a deflection in each of the four deflecting regions (11 to 14) by angles having the same magnitudes. These angles amount to 90° in each case in the filter described in greater detail with respect to FIG. 3.

As can also be seen in FIG. 1, the electrons are deflected in the first deflecting system 11 and in the fourth deflecting system 14 by the same amount in magnitude as well as directionally so that both deflecting systems can be configured by means of poleshoes, which are correspondingly large, as a common deflecting system that the electrons run through twice.

In total, the energy filter is configured as a so-called straight-line filter, that is, the optical axis (dot-dash line) on which an electron having the desired energy is moved, is, when leaving the energy filter, coaxial to the optical axis before entry into the energy filter.

The energy filter is a so-called double imaging energy filter. The filter images the input image plane BE achromatically and stigmatically into the output image plane BA. At the same time, the energy filter images the input diffraction plane DE stigmatically and dispersively into the dispersion plane DA. A stigmatic intermediate image of the input image plane BE is formed between the second deflecting region 12 and the third deflecting region 13.

The energy filter includes a total of seven hexapole correctors (S1 to S7). Two first hexapoles (S1, S7) are mounted in the input image plane BE and the output image plane BA, respectively. A further hexapole S4 is mounted between the second and third deflecting systems (12, 13) in the symmetry plane M. Because of the selected position of these hexapoles along the optical axis, these hexapoles only influence the image errors when imaging the input diffraction plane DE into the dispersion plane DA.

Two further hexapoles (S2, S3) are mounted between the first and second deflecting systems (11, 12) and, symmetrically thereto, two further hexapoles (S5, S6) are mounted between the third and fourth deflecting systems (13, 14). These four hexapoles are positioned close to astigmatic intermediate images of the input diffraction plane DE. For this reason, these hexapoles have only a slight influence on the imaging of the input diffraction plane into the dispersion plane DA and primarily influence imaging errors occurring when imaging the input image plane BE into the achromatic image plane BA.

Figure 2A:
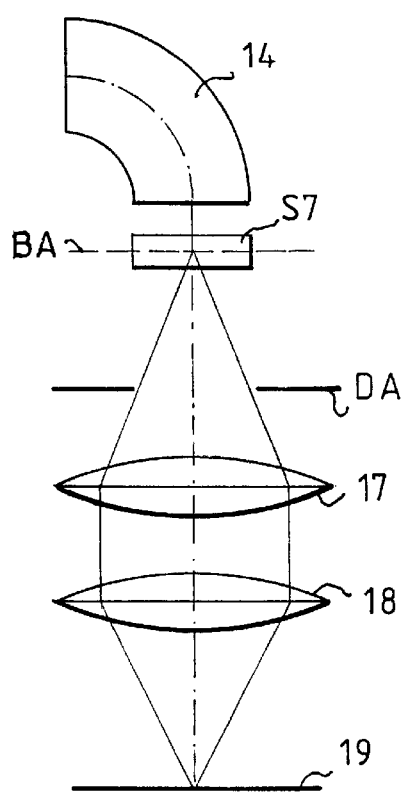
FIG. 2a is a schematic showing the beam path in the lower portion of the electron microscope of FIG. 1 when imaging the achromatic image plane into the detector plane.
Figure 2B:
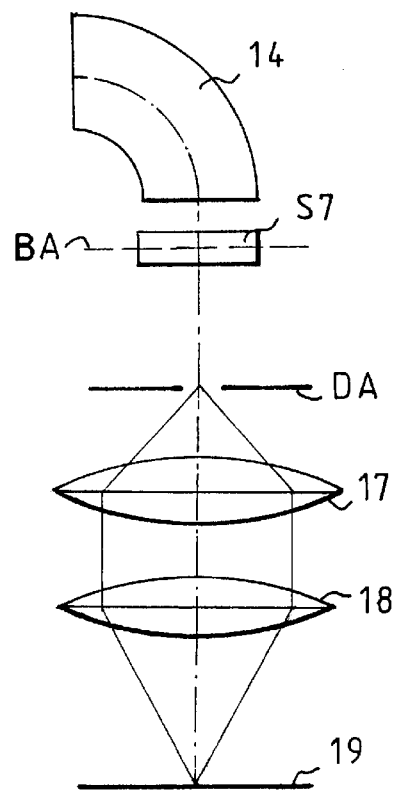
FIG. 2b is a schematic showing the beam path in the lower portion of the electron microscope of FIG. 1 when imaging the dispersion plane into the detector plane; and, FIG. 3 is an enlarged schematic, in section, of the energy filter in the electron microscope of FIG. 1.

Viewed in the beam direction, a two-stage projection system (17, 18) follows the energy filter. This projection system (17, 18) selectively images either the achromatic image plane BA or the dispersion plane DA magnified into the detector plane in which a CCD camera or a CCD line 19 is mounted. The imaging of the achromatic image plane BA into the detector plane is shown in FIG. 2a and the imaging of the dispersion plane DA into the detector plane is shown enlarged in FIG. 2b. When imaging the achromatic image plane BA onto the CCD camera, an energy filtered object image is recorded with the CCD camera or an energy filtered image of the object diffraction diagram is recorded therewith. For the filtering of energy, a slit diaphragm is then mounted in the dispersion plane DA through which only those electrons transmit which have the desired energy or a deviation thereof defined by the slit width.

When imaging the dispersion plane DA on the CCD camera 19, the entire energy spectrum of the electrons is detected in parallel behind the energy filter, that is, the so-called energy loss spectrum. No energy selection of any kind takes place in the dispersion plane DA in this case. The slit diaphragm, which is required for the energy selection, is removed from the beam path for this purpose.

When recording the object image or when recording object diffraction diagrams, the hexapoles (S1 to S7) corresponding to the arrangements, which are known from the dissertation mentioned initially herein or the article mentioned initially herein, are so excited that all geometric aberrations of the second order are corrected in the achromatic image plane BA and in the dispersion plane DA. The hexapole field intensities kn are presented in Table II below and correspond to equation 1. The hexapole field intensities kn are normalized to the deflection radius Ro in the deflection systems. The equation 1 is presented below:

$$k_n = (e/2m_0 \phi^*)^{1/2} \psi^{(n)}_{3s} d_n / R_0$$

wherein:

e is the elementary charge;

$m_0$ is the rest mass of the electron;

$\phi$ is the acceleration potential of the electrons;

$\psi_{3s}^n$ is the hexapole potential of the n-th hexapole; and, $d_n$ is the effective operating length of the n-th hexapole.

For this adjustment of the hexapoles, all geometric errors of the second order are corrected in the achromatic image plane and in the dispersion plane. At the same time, the chromatic aberrations in the achromatic image plane are corrected which are dependent upon the axis spacing of the image points and upon the energy deviation. In contrast, the axial chromatic aberration in the achromatic image plane and in the dispersion plane are uncorrected. These chromatic aberrations are, however, hardly disturbing in this imaging mode because only a narrow energy spectrum is selected for the further imaging via the selection diaphragm mounted in the dispersion plane.

When imaging the dispersion plane DA into the detector plane 19, the excitation of three hexapoles (namely the hexapole S2 directly behind the first deflection system, the hexapole S6 symmetrical thereto and directly in front of the fourth deflection system 14, and the hexapole S4 in the symmetry plane) is changed opposite to the excitation when imaging the achromatic image plane. In this way, a correction of the axial chromatic aberration in the dispersion plane is achieved. At the same time, the spherical aberration continues to be corrected in the achromatic image plane and in the dispersion plane. With the change of the hexapole field intensities, several geometric image errors of the second order are uncorrected in the achromatic image plane but these errors are hardly disturbing in the registration of the spectrum. Furthermore, the axial chromatic aberration in the achromatic image plane remains uncorrected. This too however does not constitute a disturbance because the influence of this chromatic aberration on the lateral resolution remains slight even for a selection of a large energy window.

The required different hexapole excitations can be theoretically computed for both different correction states. Proceeding from the correction state wherein all geometric image errors of the second order vanish, it is however possible to also change the excitation of the first hexapole behind the first deflection region and the excitation of the hexapole symmetrical thereto and, simultaneously, to change the excitation of the hexapole in the symmetry plane in the opposite direction so that the spherical aberration of the second order vanishes at each time point. For this purpose, the caustic figure can be viewed in the dispersion plane in the dispersive direction and hexapole changes take place so that always a round caustic cross section occurs. The determined hexapole field intensities are then stored in the memory of a control computer 15 together with the respective corresponding excitations of the projection system (17, 18). When there is a switchover of the projection system (17, 18) via a corresponding switchover 16, the excitations of the three hexapoles (S2, S4, S6) are simultaneously changed with a switchover of the projection mode. The input unit for the switchover 16 can be configured either as a hardware switch on the operating console of the electron microscope or as a virtual switch surface on a monitor to which a computer cursor can be moved and triggered with the latter.

The specific constructive parameters for an omega filter are given in the Table I which follows and the excitations of the hexapole, which are necessary for the different operating modes, are presented in Table II. All lengths and distances are then formed to the deflection radius Ro in the deflection systems. Parameter LD in Table I is the distance between the input diffraction plane DE and the input edge of the first deflection region 11 and parameter LB is the distance of the input image plane BE from the entry edge of the first deflection region 11. Parameter $L_{12}$ is the drift distance between the first deflection region 11 and the second deflection region 12, that is, the distance between the exit edge of the first deflection region and the entry edge of the second deflection region. Parameter $L_2$ is the distance from the exit edge of the first deflection region 11 to the center plane of the second hexapole S2 and parameter $L_3$ is the distance between the exit edge of the first deflection region 11 and the center plane of the third hexapole S3. Parameter $L_4$ is the distance between the exit boundary of the second deflection region 12 and the symmetry plane M. All other constructive parameters result automatically because the filter is configured mirror symmetrically to the symmetry plane M. ($k_1$ to $k_7$) are the hexapole field intensities of the hexapoles (S1 to S7) The deflection angle is 90° in each of the deflection regions (11 to 14).

TABLE I

| Parameter | $L_D$ | $L_B$ | $L_{12}$ | $L_2$ | $L_3$ | $L_4$ |
|---|---|---|---|---|---|---|
| Filter | 2.33 | 0.33 | 1.88 | 0.43 | 1.04 | 0.36 |

TABLE II

| Hexapole Field Intensities $k_n$ | S1/S7 $k_1 = k_7$ | S2/S6 $k_2 = k_6$ | S3/S5 $k_3 = k_5$ | S4 $k_4$ | $C_{\gamma\gamma\kappa}$ | $A_{\gamma\gamma}/B_{\gamma\delta\delta}$ |
|---|---|---|---|---|---|---|
| Filter Uncorrected | 0 | 0 | 0 | 0 | +87 | −53.3/−34 |
| Filter in Second Order corrected | 4.08 | −6.8 | 26.73 | 0.64 | −60 | 0/0 |
| Correction $C_{\gamma\gamma\kappa}$ | 4.08 | −3.65 | 26.73 | 1.80 | −0.7 | 0/0 |

The invention has been explained above with respect to an embodiment wherein the energetic filtering takes place via a simple slit diaphragm when imaging the achromatic image plane into the detector plane. However, the invention can also be used with the arrangements described in U.S. patent application Ser. No. 09/145,397, filed Sep. 1, 1998, wherein a multistep diaphragm is mounted in the dispersion plane or in a plane conjugated thereto and a double deflecting system is mounted between the achromatic image plane and the dispersion plane. The axial chromatic aberration of the filter for the imaging of the dispersion plane into the detector plane should be so adjusted that the chromatic aberrations too are compensated for insofar as the double deflecting systems and/or the magnet lenses cause additional chromatic aberrations. The magnetic lens is utilized for the return deflection of the electron beam.

It is understood that the foregoing description is that of the preferred embodiments of the invention and that various changes and modifications may be made thereto without departing from the spirit and scope of the invention as defined in the appended claims.

What is claimed is:

1. An electron microscope defining an electron beam path to a detector plane, the electron microscope comprising:

an imaging magnetic energy filter including a plurality of magnetic deflecting systems arranged symmetrically to a center plane (M) and a plurality of hexapoles arranged between said magnetic deflecting systems;

a projection system disposed along said electron beam path downstream of said energy filter;

said energy filter defining a dispersion plane (DA) and an achromatic image plane (BA);

a control unit operatively connected to said projection system for switching over said projection system for selectively imaging said dispersion plane (DA) and said achromatic image plane (BA) into said detector plane; and, said control unit also being operatively connected to said hexapoles for changing the excitation of at least some of said hexapoles at the same time as the switchover of said projection system.

2. The electron microscope of claim 1, wherein said hexapoles are so excited when said projection system images said dispersion plane (DA) that spherical aberrations of the second order and the axial chromatic aberrations of said energy filter are corrected.

3. The electron microscope of claim 2, wherein, at the same time, a portion of geometric aberrations other than spherical aberrations in said achromatic image plane (BA) are uncorrected.

4. The electron microscope of claim 1, wherein said energy filter and said projection system conjointly define a composite system; and, said hexapoles are so excited when said projection system images said dispersion plane (DA) that spherical aberrations of the second order and the axial chromatic aberrations of said composite system are corrected.

5. The electron microscope of claim 4, wherein, at the same time, a portion of geometric aberrations other than spherical aberrations in said achromatic image plane (BA) are uncorrected.

6. The electron microscope of claim 1, wherein said hexapoles are so excited when said projection system images said achromatic image plane (BA) that geometric aberrations of the second order in said achromatic image plane (BA) and in said dispersion plane (DA) are corrected.

7. The electron microscope of claim 1, wherein said center plane (M) is a symmetry plane (M); said plurality of magnetic deflection systems are at least four magnetic deflection systems and said plurality of hexapoles are at least five hexapoles; first and second ones of said hexapoles are disposed between first and second ones of said magnetic deflection systems and third and fourth ones of said hexapoles are disposed symmetrically to said first and second hexapoles and between third and fourth ones of said magnetic deflection systems; and, a fifth one of said hexapoles is disposed in said symmetry plane (M).

8. The electron microscope of claim 7, wherein, when the switchover of said projection system for said imaging occurs, only the excitation is changed of: one of said first and second hexapoles between said first and second deflecting systems; one of said third and fourth hexapoles between said third and fourth deflecting systems; and, said hexapole disposed in said symmetry plane (M).

9. The electron microscope of claim 8, wherein said energy filter has an input end plane (BE) conjugated to said achromatic image plane (BA); and, further comprising two additional hexapoles arranged in said achromatic image plane (BA) and said input end plane (BE), respectively.

10. The electron microscope of claim 9 wherein the excitation of said fifth hexapole in said symmetry plane (M) when imaging said dispersion plane (DA) is greater by a factor of 2 to 4 than when imaging said achromatic image plane (BA).

11. The electron microscope of claim 10, wherein said factor is 2.81.

12. The electron microscope of claim 8, wherein the excitation of the first hexapole behind said first magnetic deflecting system when imaging said achromatic image plane (BA) is greater by a factor of 1.5 to 2.5 than when imaging said dispersion plane (DA).

13. The electron microscope of claim 12, wherein said factor is 1.87.

14. An electron microscope defining an electron beam path to a detector plane, the electron microscope comprising:

an imaging magnetic energy filter including a plurality of magnetic deflecting systems arranged symmetrically to a center plane (M) and a plurality of hexapoles arranged between said magnetic deflecting systems;

a projection system disposed along said electron beam path downstream of said energy filter;

said energy filter defining a dispersion plane (DA) and an achromatic image plane (BA);

a control unit operatively connected to said projection system for switching over said projection system for selectively imaging said dispersion plane (DA) and said achromatic image plane (BA) into said detector plane;

said control unit also being operatively connected to said hexapoles for changing the excitation of at least some of said hexapoles at the same time as the switchover of said projection system;

said center plane (M) being a symmetry plane (M);

said plurality of magnetic deflection systems being at least four magnetic deflection systems and said plurality of hexapoles being at least five hexapoles;

first and second ones of said hexapoles being disposed between first and second ones of said magnetic deflection systems and third and fourth ones of said hexapoles being disposed symmetrically to said first and second hexapoles and between third and fourth ones of said magnetic deflection systems;

a fifth one of said hexapoles being disposed in said symmetry plane (M);

when the switchover of said projection system for said imaging occurs, only the excitation is changed of: one of said first and second hexapoles between said first and second deflecting systems; one of said third and fourth hexapoles between said third and fourth deflecting systems; and, said hexapole disposed in said symmetry plane (M);

said first hexapole and said fourth hexapole being symmetrical to each other relative to said symmetry plane (M); and, the excitation change of said first hexapole between said first and second magnetic deflection systems and the excitation change of said fourth hexapole between said third and fourth magnetic deflecting systems being opposite to the excitation change of said fifth hexapole disposed in said symmetry plane (M).

* * * * *

UNITED STATES PATENT AND TRADEMARK OFFICE
CERTIFICATE OF CORRECTION

PATENT NO.   : 6,384,412 B1
DATED        : May 7, 2002
INVENTOR(S)  : Dieter Krahl and Stephan Kujawa It is certified that error appears in the above-identified patent and that said Letters Patent is hereby corrected as shown below:

Column 1,
Line 54, delete "$C_{Yk.}$" and substitute -- $C_{Yk}$ -- therefor.

Column 6,
Line 33, delete "$\Psi_{3S}{}^n$" and substitute -- $\Psi_{3s}{}^n$ -- therefor.

Column 7,
Line 24, delete "formed" and substitute -- normed -- therefor.
Line 25, delete "LD" and substitute -- $L_D$ -- therefor.
Line 27, delete "LB" and substitute -- $L_B$ -- therefor.
Line 42, a period should be inserted between "S7)" and "The".

Column 9,
Line 21, a comma should be inserted between "9" and "wherein".

Signed and Sealed this

Fifteenth Day of April, 2003

JAMES E. ROGAN
*Director of the United States Patent and Trademark Office*